(12) United States Patent
Lo

(10) Patent No.: US 12,158,500 B2
(45) Date of Patent: Dec. 3, 2024

(54) SYSTEM AND METHOD WHICH CAN REDUCE CIRCUIT AREA WHILE PERFORMING TEST FUNCTION

(71) Applicant: Realtek Semiconductor Corp., HsinChu (TW)

(72) Inventor: Yu-Cheng Lo, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 105 days.

(21) Appl. No.: 17/946,055

(22) Filed: Sep. 16, 2022

(65) Prior Publication Data

US 2023/0092349 A1 Mar. 23, 2023

(30) Foreign Application Priority Data

Sep. 17, 2021 (TW) ................................. 110134720

(51) Int. Cl.
*G01R 31/3185* (2006.01)

(52) U.S. Cl.
CPC ........................... *G01R 31/318541* (2013.01)

(58) Field of Classification Search
None
See application file for complete search history.

(56) References Cited

U.S. PATENT DOCUMENTS

| | | | |
|---|---|---|---|
| 8,984,354 B2 | 3/2015 | Kuo | |
| 9,666,302 B1* | 5/2017 | Chang | G11C 29/54 |
| 10,852,353 B1* | 12/2020 | Kawoosa | G01R 31/3177 |
| 2015/0185283 A1* | 7/2015 | Mittal | G01R 31/3177 |
| | | | 714/731 |
| 2018/0019734 A1* | 1/2018 | Vattikonda | G01R 31/31704 |
| 2018/0059178 A1* | 3/2018 | Wang | G01R 31/31723 |
| 2018/0238965 A1* | 8/2018 | Anzou | G11C 11/418 |
| 2020/0273532 A1* | 8/2020 | Lin | G11C 29/38 |
| 2020/0355744 A1* | 11/2020 | Narayanan | G01R 31/318552 |
| 2021/0074353 A1 | 3/2021 | Chen | |
| 2021/0359667 A1* | 11/2021 | Dia | H03K 3/012 |
| 2022/0244308 A1* | 8/2022 | Srinivasan | G01R 31/318555 |
| 2023/0005562 A1* | 1/2023 | Pilo | G11C 29/40 |
| 2023/0092349 A1* | 3/2023 | Lo | G11C 29/40 |
| | | | 714/726 |

FOREIGN PATENT DOCUMENTS

| | | |
|---|---|---|
| TW | 201248638 | 12/2012 |
| TW | I739716 B | 9/2021 |

* cited by examiner

*Primary Examiner* — Daniel F. McMahon
(74) *Attorney, Agent, or Firm* — Winston Hsu

(57) ABSTRACT

A system, comprising: a plurality of first latches; a compressor circuit, coupled to the first latches, configured to compress an first signal having X bits from the first latches to a second signal having Y bits, wherein X and Y are positive integers and X is larger than Y; and at least one second latch, coupled to the compressor circuit, configured to receive the second signal to generate a scan output, wherein each of the first latches and the second latch forms a D flip flop. The system outputs the first signal but none of the scan output in a normal mode, and outputs the scan output but none of the first signal in a test mode.

17 Claims, 6 Drawing Sheets

SYSTEM AND METHOD WHICH CAN REDUCE CIRCUIT AREA WHILE PERFORMING TEST FUNCTION

BACKGROUND OF THE INVENTION

1. Field of the Invention

The present invention relates to a system and a method, and particularly relates to a system and a method which can reduce circuit areas.

2. Description of the Prior Art

In the prior art, a test system for testing SRAM (Static Random Access Memory) comprises a scan chain to test the signal input to the SPAM. However, this scan chain comprises a large number of latches and multiplexers, which not only increase the circuit area, but also increase the signal delay during scanning.

Therefore, a new test system is needed to solve the above-mentioned problems.

SUMMARY OF THE INVENTION

Therefore, one objective of the present is to provide a test system which can reduce circuit areas and signal delay time.

Another objective of the present is to provide a test method which can reduce circuit areas and signal delay time.

One embodiment of the present invention discloses a system, comprising: a plurality of first latches; a compressor circuit, coupled to the first latches, configured to compress an first signal having X bits from the first latches to a second signal having Y bits, wherein X and Y are positive integers and X is larger than Y; and at least one second latch, coupled to the compressor circuit, configured to receive the second signal to generate a scan output, wherein each of the first latches and the second latch forms a D flip flop. The system outputs the first signal but none of the scan output in a normal mode, and outputs the scan output but none of the first signal in a test mode.

Another embodiment of the present invention discloses a method, applied to a system, comprising: compressing an first signal having X bits from a plurality of first latches to a second signal having Y bits, wherein X and Y are positive integers and X is larger than Y; receiving the second signal by at least one second latch to generate a scan output, wherein each of the first latches and the second latch forms a D flip flop; and outputting the first signal but none of the scan output in a normal mode, and outputting the scan output but none of the first signal in a test mode.

In view of above-mentioned embodiments, the circuit area and signal delay required for the test can be greatly reduced, so that the problems of the conventional test system can be improved.

These and other objectives of the present invention will no doubt become obvious to those of ordinary skill in the art after reading the following detailed description of the preferred embodiment that is illustrated in the various figure and drawings.

DETAILED DESCRIPTION

Several embodiments are provided in following descriptions to explain the concept of the present invention. Each component in following descriptions can be implemented by hardware (e.g. a device or a circuit) or hardware with software (e.g. a program installed to a processor). Besides, the method in following descriptions can be executed by programs stored in a non-transitory computer readable recording medium such as a hard disk, an optical disc or a memory. Additionally, the term "first", "second", "third" in following descriptions are only for the purpose of distinguishing different one elements, and do not mean the sequence of the elements. For example, a first device and a second device only mean these devices can have the same structure but are different devices.

Figure 1:
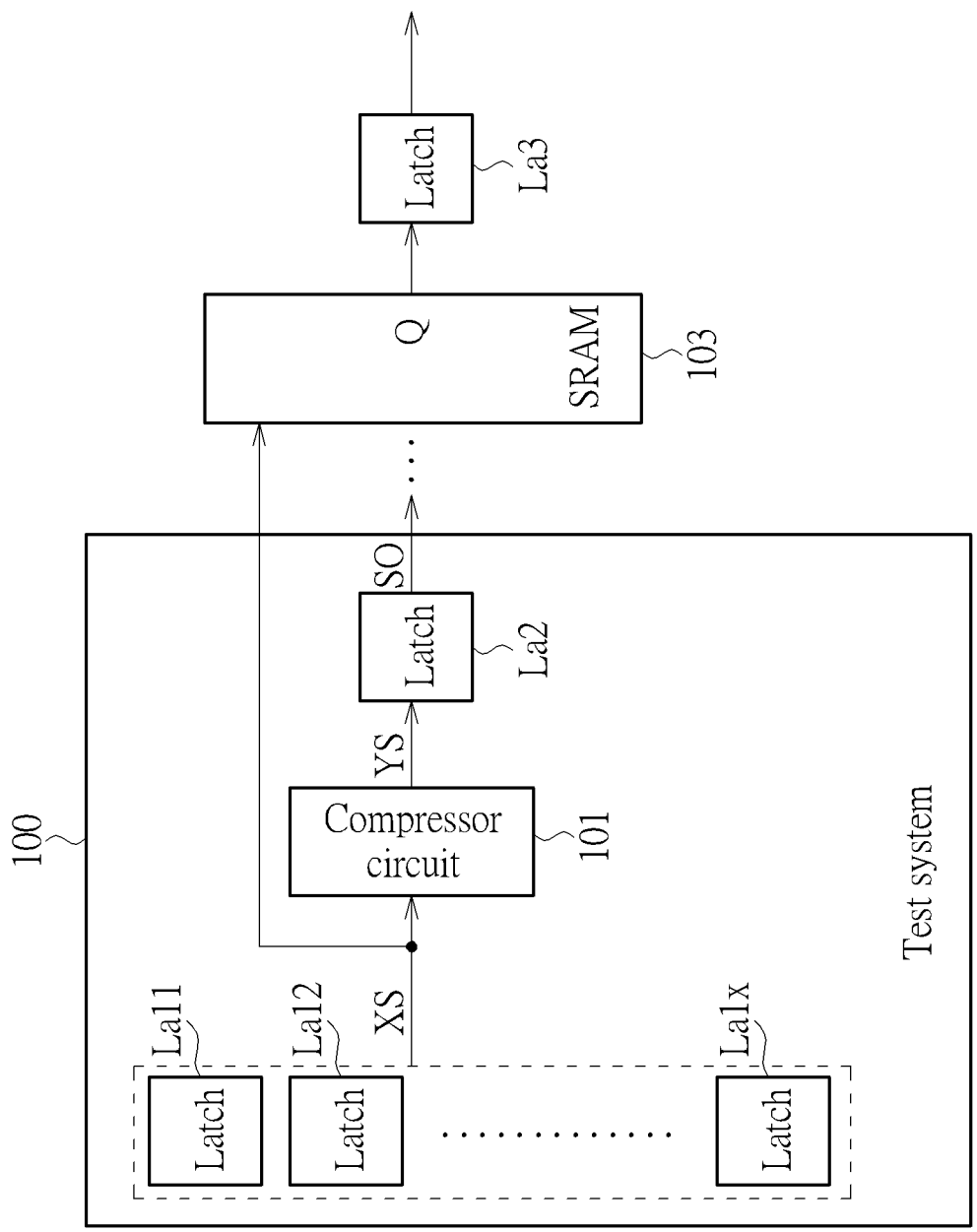
FIG. 1, FIG. 2 and FIG. 3 are circuit diagrams illustrating test systems according to different embodiments of the present invention.

As shown in FIG. 1, the test system 100 comprises a plurality of first latches La11, La12 . . . La1$x$, an compressor circuit 101, and at least one second latch La2. The compressor circuit 101 is coupled to the first latches La11, La12 . . . La1$x$ for compressing the first signal XS output by the first latches La11, La12 . . . La1$x$ into a second signal YS. The first signal XS has X bits and the second signal YS has Y bits. X and Y are positive integers and X is larger than Y. In following embodiments, Y is 1 and a number of the second latch La2 is 1, but the number of the second latch La2 may be different corresponding to Y. The second latch La2 is coupled to the compressor circuit 101 for receiving the second signal YS to generate a scan output SO, wherein each of the first latch La11, La12 . . . La1$x$ and the second latch La2 are formed a D flip flop. For example, the first latch La11 and the second latch La2 form a D flip flop, and the first latch La12 and the second latch La2 form a D flip flop. The test system 100 outputs an first signal XS to the SRAM 103 in a normal mode (or named function mode) and outputs a scan output SO to the SRAM 103 in a test mode (or named scan mode). The scan output SO is then connected in series with a scan chain external to the SRAM 103.

The test system 100 outputs an first signal XS to the SRAM 103 in the normal mode to allow the SRAM 103 to operate normally, and generates a scan output SO to the SRAM 103 in the test mode. In one embodiment, the scan output SO is received by a predetermined pin of the SRAM 103, and the first signal XS can be received by different pins of the SRAM 103 according to different requirements. Also, the first signal XS may contain different signals depending on different requirements. In one embodiment, the first signal XS may comprise at least one of the following signals: a data signal, an address signal, a write enable signal, or a memory enable signal of the SRAM 103. For example, the first signal XS may comprise a data signal and an address signal, or comprise a write enable signal and a memory enable signal. The write enable signal is used to enable the write function of the SRAM 103 and the memory enable signal is used to enable the SRAM 103. In one embodiment, the test system 100 may further comprise a third latch La3, which is coupled to the data output terminal Q of the SRAM 103.

Figure 2:
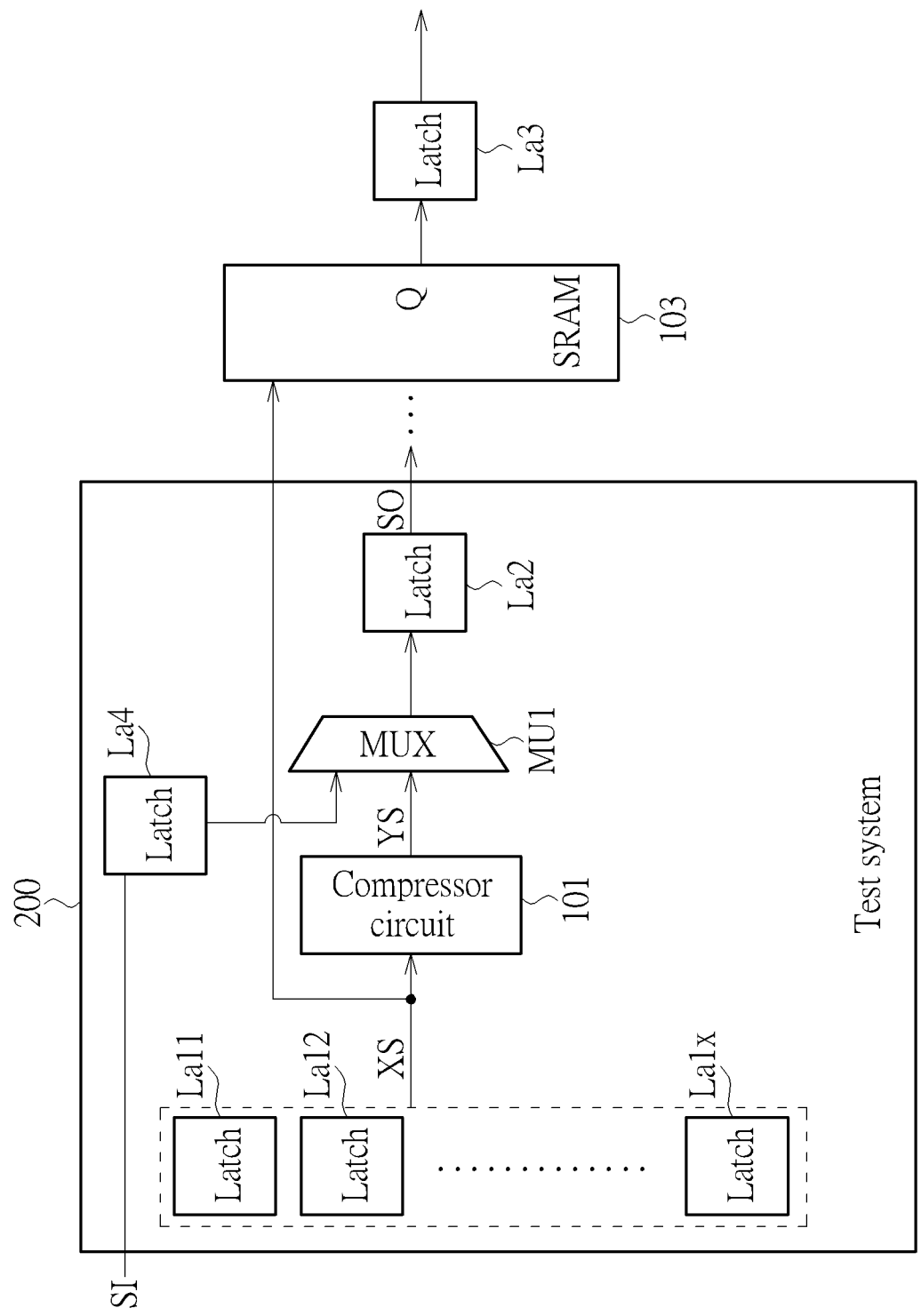

In addition to the test mechanism and path shown in FIG. 1, the test system provided by the present invention may further comprise other test mechanisms and paths. FIG. 2 is a circuit diagram of a test system according to another embodiment of the present invention. In addition to the first latches La11 . . . La1x, the compressor circuit 101, and the latch La2 comprised in the test system 100 in FIG. 1, the test system 200 in FIG. 2 further comprises a fourth latch La4 and a first multiplexer MU1. The first multiplexer MU1 comprises an output terminal coupled to the second latch La2, a first input terminal receiving the second signal YS, and a second input terminal receiving an output of the fourth latch La4.

The fourth latch La4 and the second latch La2 can form a D flip flop. Therefore, the fourth latch La4 and the second latch La2 can be regarded as a reserved additional scan paths, which can be used to receive the test signal input from the outside of the test system 200.

Therefore, in the embodiment of FIG. 2, the test system 200 outputs the first signal XS to the SRAM 103 but does not output the scan output SO in a normal mode, and outputs the scan output SO but does not output the first signal XS to the SRAM 103 in a test mode, and can operate in an external test mode. In the external test mode, the test signal input from the outside of the test system 200 is received by the fourth register La4.

Figure 3:
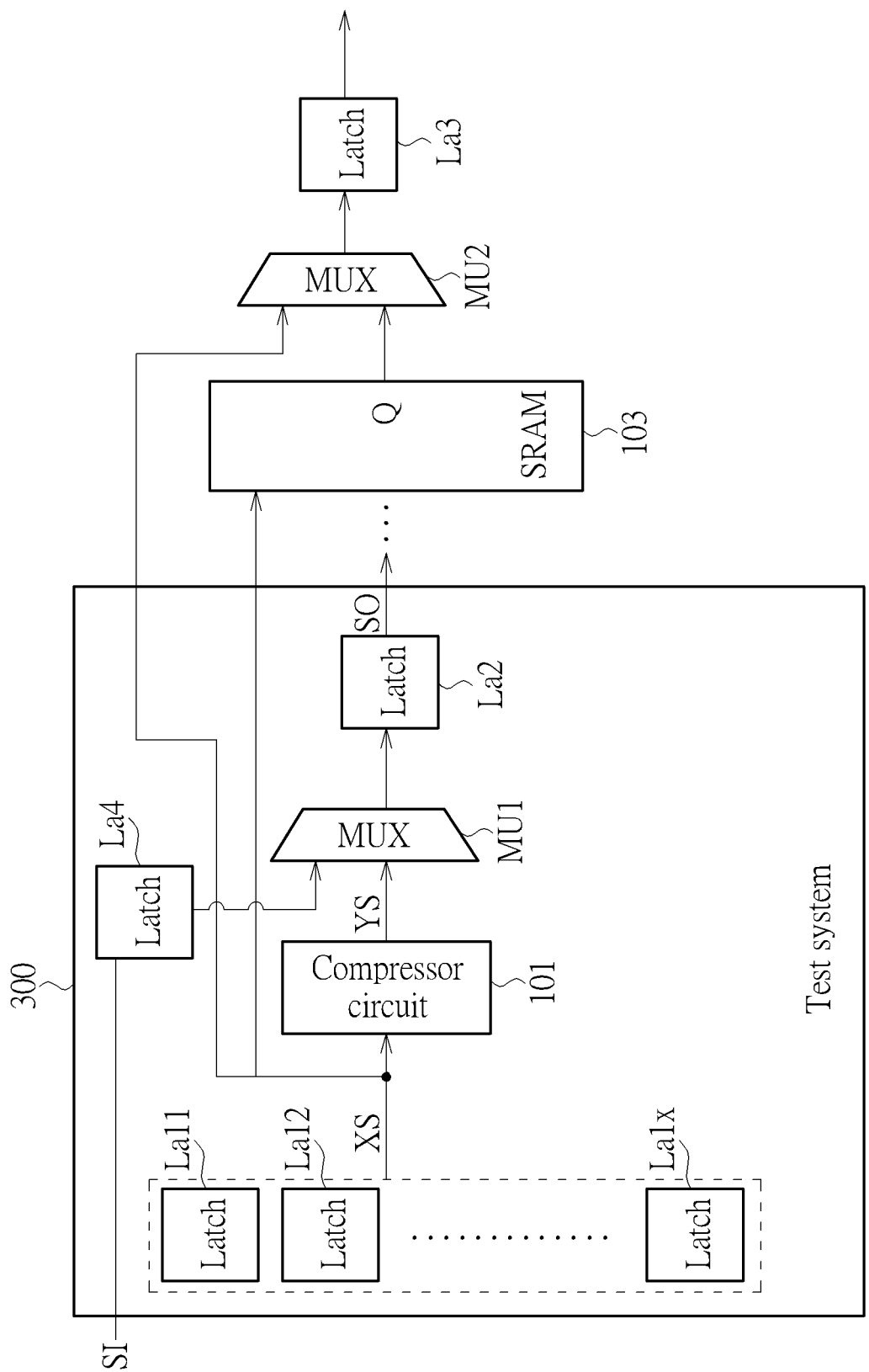

In addition to the path shown in FIG. 2, the test system provided by the present invention may further comprise other paths. FIG. 3 is a circuit diagram of a test system according to another embodiment of the present invention. In addition to the first latches La11 . . . La1x, the compressor circuit 101, and the second latch La2 comprised in the test system 100 in FIG. 1, the test system 300 in FIG. 3 further comprises a fourth latch La4, a first multiplexer MU1 and a second multiplexer MU2. The first multiplexer MU1 comprises an output terminal coupled to the second latch La2, a first input terminal receiving the second signal YS, and a second input terminal receiving an output of the fourth latch La4. The fourth latch La4 and the second latch La2 can form a D flip flop. Therefore, the fourth latch La4 and the second latch La2 can be regarded as a reserved additional scan path, which can be used to receive the test signal input from the outside of the test system 300. The second multiplexer MU2 comprises a first input terminal for receiving the first signal XS and a second input terminal for receiving an output of the SRAM 103.

Therefore, in the embodiment of FIG. 3, the test system 200 outputs the first signal XS to the SRAM 103 but does not output the scan output SO in a normal mode, and outputs the scan output SO but does not output the first signal XS to the SRAM 103 in a test mode, and can operate in an external test mode. In the external test mode, the test system 300 receives a test signal input from outside. In addition, the test system 300 outputs the first signal XS to the second multiplexer MU2 in a bypass mode. In the embodiment in FIG. 3, the path from the first latches La11 . . . La1x to the compressor circuit 101 then to the first multiplexer MU1 then to the second latch La2 can be regarded as a scan capture path in the SRAM test. The path from the fourth latch La4 to the first multiplexer MU1 then to the second latch La2 can be regarded as a scan shift path in the SRAM test. The first latches La11 . . . La1x to the second multiplexer MU2 can be regarded as a scan bypass path in the SRAM test.

Figure 4:
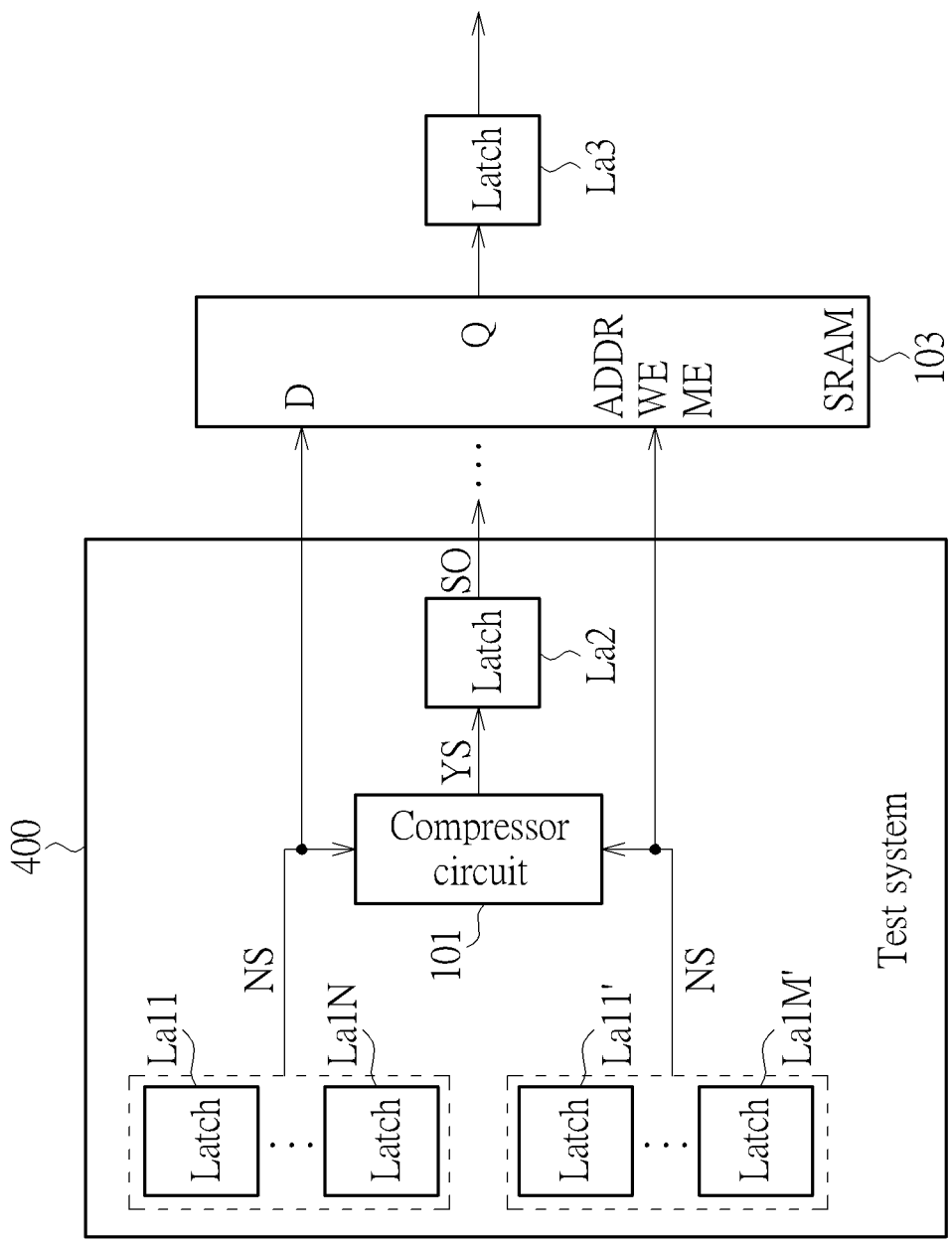
FIG. 4 and FIG. 5 are circuit diagrams illustrating test systems, which comprises a plurality groups of first latches, according to different embodiments of the present invention.

The first latches La1, La2 . . . Lax in the above-mentioned embodiments may have different arrangements corresponding to different requirements. FIG. 4 is a circuit diagram of a test system according to another embodiment of the present invention, which has a plurality of groups of first latches La1, La2 . . . Lax. As shown in FIG. 4, the test system 400 comprises two groups of first latches. One group of first latches comprises N latches La11-La1N for generating the N bit signal NS, and the other group of first latches comprises M latches La11'-La1M' to generate the M bit signal MS. N+M is less than Y, and Y is 1 in one embodiment. In the embodiment of FIG. 4, the M bit signal MS comprises an address signal, a write enable signal, and a memory enable signal of the SRAM 103, and the N bit signal NS is a data signal. In this case, the N bit signal NS is received by the data terminal D of the SRAM 103, and the M bit signal MS is respectively received by the address terminal ADDR, the write enable terminal WE, and the memory enable terminal ME of the SRAM 103.

Therefore, in the embodiment of FIG. 4, in the normal mode, the test system 400 outputs an N bit signal NS to the data terminal D of the SRAM 103, and outputs an M bit signal MS to the address terminal ADDR, a write enable terminal WE, and a memory enable terminal ME of the SRAM 103. In the test mode, the test system 400 generates a scan output SO to the SRAM 103.

Figure 5:
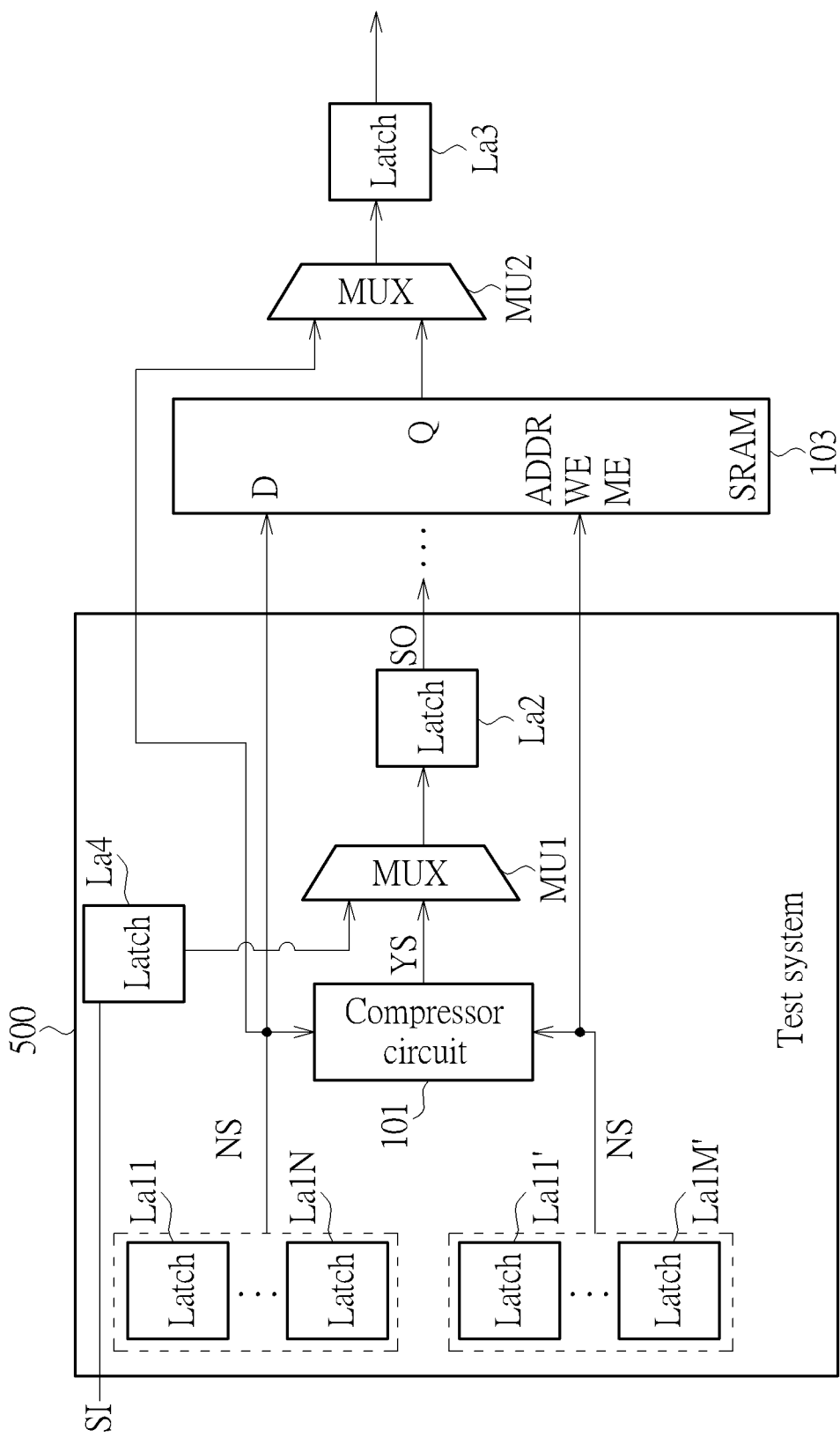

The aforementioned architectures in FIG. 2 and FIG. 3 can also be applied to the embodiment in FIG. 4. FIG. 5 is a circuit diagram of a test system according to another embodiment of the present invention. In addition to the components shown in FIG. 4, the test system 500 in FIG. 5 further comprises a fourth latch La4, a first multiplexer MU1, and a second multiplexer MU2.

The fourth latch La4 and the second latch La2 can form a D flip flop. Therefore, the fourth latch La4 and the second latch La2 can be regarded as a reserved additional scan path, which can be used to receive the test signal input from the outside of the test system 500. The second multiplexer MU2 comprises a first input terminal for receiving the N bit signal NS and a second input terminal for receiving an output of the SRAM 103. However, please note that in the embodiment of FIG. 5, the second multiplexer MU2 only receives the N bit signal NS but does not receive the M bit signal.

Therefore, in the embodiment of FIG. 5, the test system 500 outputs the N bit signal NS and the M bit signal MS to the SRAM 103 in a normal mode and outputs the scan output SO to the SRAM 103 in a test mode. Further, the test system 500 receives test signals from outside of the test system 500 in an external test mode. In addition, the test system 500 outputs an N bit signal NS to the second multiplexer MU2 in a bypass mode. In the embodiment of FIG. 5, the path from the first latch La11 . . . La1N, La11' . . . La1M' to the compressor circuit 101 then to the first multiplexer MU1 then to the second latch La2 can be regarded as a scan capture path in the SRAM test. Also, the path from the fourth latch La4 to the first multiplexer MU1 then to the second latch La2 can be regarded as a scan shift path in the SRAM test. The first latches La11 . . . La1N to the second multiplexer MU2 can be regarded as a scan bypass path in the SRAM test.

In the embodiment of FIG. 5, the M bit signal MS comprises an address signal, a write enable signal, and a memory enable signal, and the N bit signal NS is a data signal of the SRAM 103. In this case, the N bit signal NS is received by the data terminal D of the SRAM 103, and the M bit signal MS is respectively received by the address terminal ADDR, the write enable terminal WE, and the memory enable terminal ME of the SRAM 103.

In one embodiment, the test system 500 may correspond to the embodiment in FIG. 2, that is, does not comprise the second multiplexer MU2. In such embodiment, the test system 500 outputs the N bit signal NS and the M bit signal MS to the SRAM 103 in a normal mode, and outputs the scan output SO to the SRAM 103 in a test mode, and can receive test signals from outside of the test system 500 in an external test mode. Besides, in this embodiment, the output of the SRAM 103 can be used as a test signal for its subsequent components.

Compared with the prior art, the above-mentioned embodiments can reduce the number of components. For example, if the test system uses a built-in scan chain mechanism, each first latch must operate with a second latch, and each first latch must operate with a multiplexer for mode switching. The aforementioned architecture can greatly reduce the number of latches and multiplexers, which not only greatly reduce the circuit area, but also reduce the signal delay caused by these components.

Figure 6:
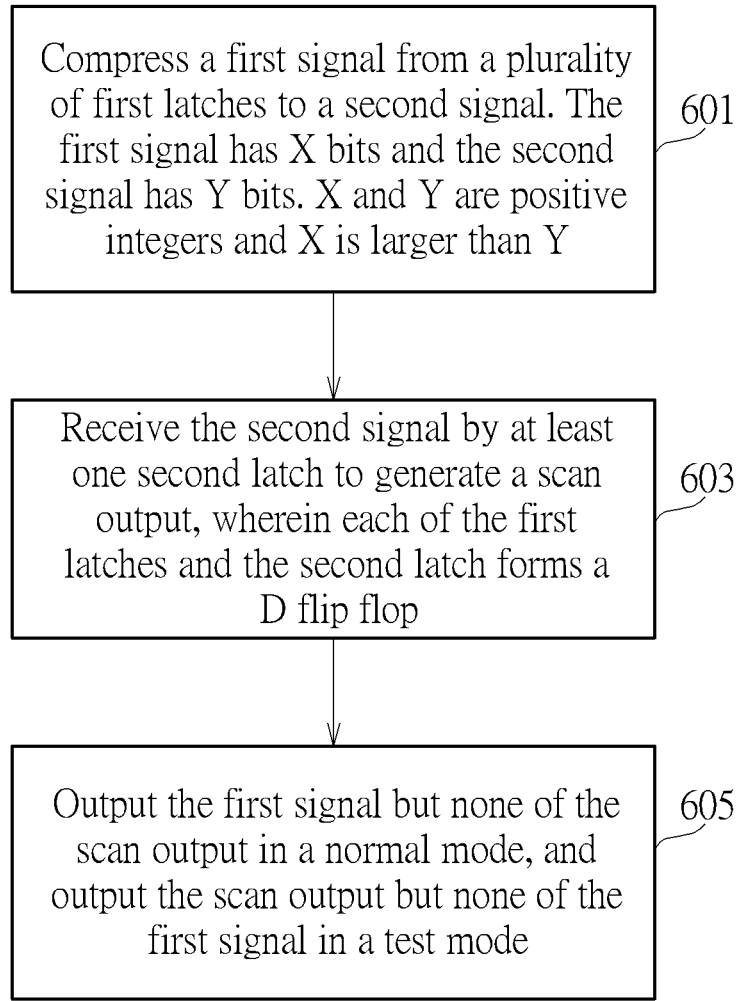
FIG. 6 is a flow chart illustrating a test method according to one embodiment of the present invention.

In view of the above-mentioned embodiments, a test method can be obtained. FIG. 6 is a flowchart of the test method according to one embodiment of the present invention, which comprises the following steps:

Step 601

Compress a first signal from a plurality of first latches to a second signal. The first signal has X bits and the second signal has Y bits. X and Y are positive integers and X is larger than Y.

Step 603

Receive the second signal by at least one second latch to generate a scan output, wherein each of the first latches and the second latch forms a D flip flop.

Step 605

Output the first signal but none of the scan output in a normal mode, and output the scan output but none of the first signal in a test mode.

The target electronic device can be a memory such as an SRAM, but can be other types of electronic devices as well.

In one embodiment, as shown in FIG. 2 of the present invention, the first signal comprises an M bit signal and an N bit signal, and the M bit signal comprises an address signal and a write enable signal and a memory enable signal, and the N bit signal is a data signal, M+N is less than Y. Other detail steps are stated in above-mentioned embodiments, thus are omitted for brevity here.

It will be appreciated that the above-mentioned test system can be applied for other applications rather than limited to "test". In such case, the test system can be regarded as a system comprising the above-mentioned components. Following the same rule, the test method illustrated in FIG. 6 can be regarded as a method comprising the steps illustrated in FIG. 6.

In view of above-mentioned embodiments, the circuit area and signal delay required for the test can be greatly reduced, so that the problems of the conventional test system can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A system, comprising:
   a plurality of first latches;
   a compressor circuit coupled to the first latches and configured to compress a first signal having X bits from the first latches to a second signal having Y bits, X and Y being positive integers and X being larger than Y; and
   at least one second latch, coupled to the compressor circuit, configured to receive the second signal to generate a scan output;
   wherein the system provides the first signal as an input to a memory but does not provide the scan output as the input to the memory in a normal mode, and provides outputs the scan output as the input to the memory but does not provide the first signal as the input to the memory in a test mode.

2. The system of claim 1, wherein Y is 1 and a number of the second latch is 1.

3. The system of claim 1, wherein the first signal comprises a data signal, an address signal, a write enable signal or a memory enable signal.

4. The system of claim 3, wherein the memory is a SRAM.

5. The system of claim 4, further comprising:
   a third latch, coupled to a data output terminal of the SRAM.

6. The system of claim 1, wherein the first signal comprises a M bit signal and a N bit signal, wherein the M bit signal comprises an address signal, a write enable signal and a memory enable signal, wherein the N bit signal is a data signal, and M+N is less than Y.

7. The system of claim 1, further comprising:
   a fourth latch; and
   a first multiplexer, comprising:
     an output terminal, coupled to the second latch;
     a first input terminal, configured to receive the second signal; and
     a second input terminal, configured to receive an output of the fourth latch.

8. The system of claim 1, further comprises:
   a second multiplexer, comprising:
     a first input terminal, configured to receive the first signal; and
     a second input terminal, configured to receive an output of the memory.

9. A method, applied to a system, comprising:
   compressing a first signal having X bits from a plurality of first latches to a second signal having Y bits, X and Y being positive integers and X being larger than Y;
   receiving the second signal by at least one second latch to generate a scan output; and
   providing the first signal as an input to a memory but not providing the scan output as the input to the memory in a normal mode, and providing the scan output as the input to the memory but not providing the first signal as the input to the memory in a test mode.

10. The method of claim 9, wherein Y is 1 and a number of the second latch is 1.

11. The method of claim 9, wherein the first signal comprises a data signal, an address signal, a write enable signal or a memory enable signal.

12. The method of claim 11, wherein the memory is a SRAM.

13. The method of claim 12, further comprising:
   providing a third latch at a data output terminal of the SRAM.

14. The method of claim 9, wherein the first signal comprises a Mbit signal and a N bit signal, wherein the M bit signal comprises an address signal, a write enable signal and a memory enable signal, wherein the N bit signal is a data signal, and M+N is less than Y.

15. The method of claim 9, wherein the test system comprises a fourth latch, wherein the test method further comprises:
   selectively outputting the second signal and an output of the fourth latch to the second latch.

16. The method of claim 9, further comprising:
selectively outputting the first signal and an output of the memory.

17. The system of claim 6, wherein the data signal is received by a data terminal of a SRAM.

* * * * *